(12) United States Patent
Nakako

(10) Patent No.: US 11,005,458 B2
(45) Date of Patent: May 11, 2021

(54) SEMICONDUCTOR INTEGRATED CIRCUIT ADAPTED TO SCAN TESTING, AND METHOD OF DESIGNING THE SAME

(71) Applicant: SYNAPTICS INCORPORATED, San Jose, CA (US)

(72) Inventor: Takahisa Nakako, Tokyo (JP)

(73) Assignee: Synaptics Incorporated, San Jose, CA (US)

( * ) Notice: Subject to any disclaimer, the term of this patent is extended or adjusted under 35 U.S.C. 154(b) by 192 days.

(21) Appl. No.: 16/279,131

(22) Filed: Feb. 19, 2019

(65) Prior Publication Data

US 2019/0267973 A1    Aug. 29, 2019

(30) Foreign Application Priority Data

Feb. 23, 2018 (JP) ............................. JP2018-031360

(51) Int. Cl.
*G06F 11/00* (2006.01)
*H03K 3/037* (2006.01)
*G01R 31/3185* (2006.01)
*G06F 30/33* (2020.01)
*G06F 30/327* (2020.01)

(52) U.S. Cl.
CPC ..... *H03K 3/037* (2013.01); *G01R 31/318541* (2013.01); *G06F 30/327* (2020.01); *G06F 30/33* (2020.01)

(58) Field of Classification Search
CPC ....... H03K 3/037; G06F 30/33; G06F 30/327; G01R 31/318541; G01R 31/318536; G01R 31/318544; G01R 31/318555; G01R 31/318558
USPC ......... 714/726, 729, 732, 733, 734; 716/4, 5
See application file for complete search history.

(56) References Cited

U.S. PATENT DOCUMENTS

2005/0060625 A1\* 3/2005 Wang ............. G01R 31/318547
                                                                            714/727
2017/0089979 A1\* 3/2017 Iwata ................ G01R 31/31727
2017/0336472 A1\* 11/2017 Tsai ................ G01R 31/318588

\* cited by examiner

*Primary Examiner* — Christine T. Tu
(74) *Attorney, Agent, or Firm* — Leydig, Voit & Mayer, Ltd.

(57) ABSTRACT

A semiconductor integrated circuit comprises a scan flipflop comprising a scan input and a data input; and scan control circuitry. The scan control circuitry is configured to control the scan flipflop to capture a value inputted to the scan input in a capture mode.

19 Claims, 12 Drawing Sheets

US 11,005,458 B2

SEMICONDUCTOR INTEGRATED CIRCUIT ADAPTED TO SCAN TESTING, AND METHOD OF DESIGNING THE SAME

CROSS REFERENCE

This application claims priority to Japanese Patent Application No. 2018-031360, filed on Feb. 23, 2018, the disclosure of which is incorporated herein by reference in its entirety.

BACKGROUND

Field

The present disclosure relates to a semiconductor integrated circuit and method of designing a semiconductor integrated circuit.

Description of the Related Art

A semiconductor integrated circuit (IC) adapted to scan testing may incorporate a scan chain in which scan flipflops are connected in series. When the semiconductor IC is tested, test data may be set to scan flipflops connected to inputs of a circuit under test, and the semiconductor IC under test is operated. An output response may be extracted from a scan flipflop connected to an output of the semiconductor IC under test, and a failure of the semiconductor IC is detected based on the extracted output response.

During test, a scan flipflop may capture an unknown value, which may make it difficult to detect a failure, resulting in a reduction of a fault coverage and/or an increasing the number of test patterns utilized during test.

SUMMARY

In one or more embodiments, a semiconductor integrated circuit comprises a scan flipflop comprising a data input connected to an output of a circuit, and scan control circuitry configured to control the scan flipflop to capture a data inputted to a scan input in a capture mode.

In one or more embodiments, a method of designing a semiconductor integrated circuit comprises generating a netlist of the semiconductor integrated circuit comprising a scan flipflop configured to capture a data inputted to a scan input of the scan flipflop in a capture mode.

In one or more embodiments, a tangible non-transitory storage medium storing a program when executed causes a computer to generate a netlist of a semiconductor integrated circuit comprising a scan flipflop configured to capture a value inputted to a scan input of the scan flipflop in a capture mode.

BRIEF DESCRIPTION OF THE DRAWINGS

So that the manner in which the above recited features of the present disclosure may be understood in detail, a more particular description of the disclosure, briefly summarized above, may be had by reference to embodiments, some of which are illustrated in the appended drawings. It is to be noted, however, that the appended drawings illustrate only some embodiments of this disclosure and are therefore not to be considered limiting of its scope, for the disclosure may admit to other equally effective embodiments.

DETAILED DESCRIPTION

Figure 1:
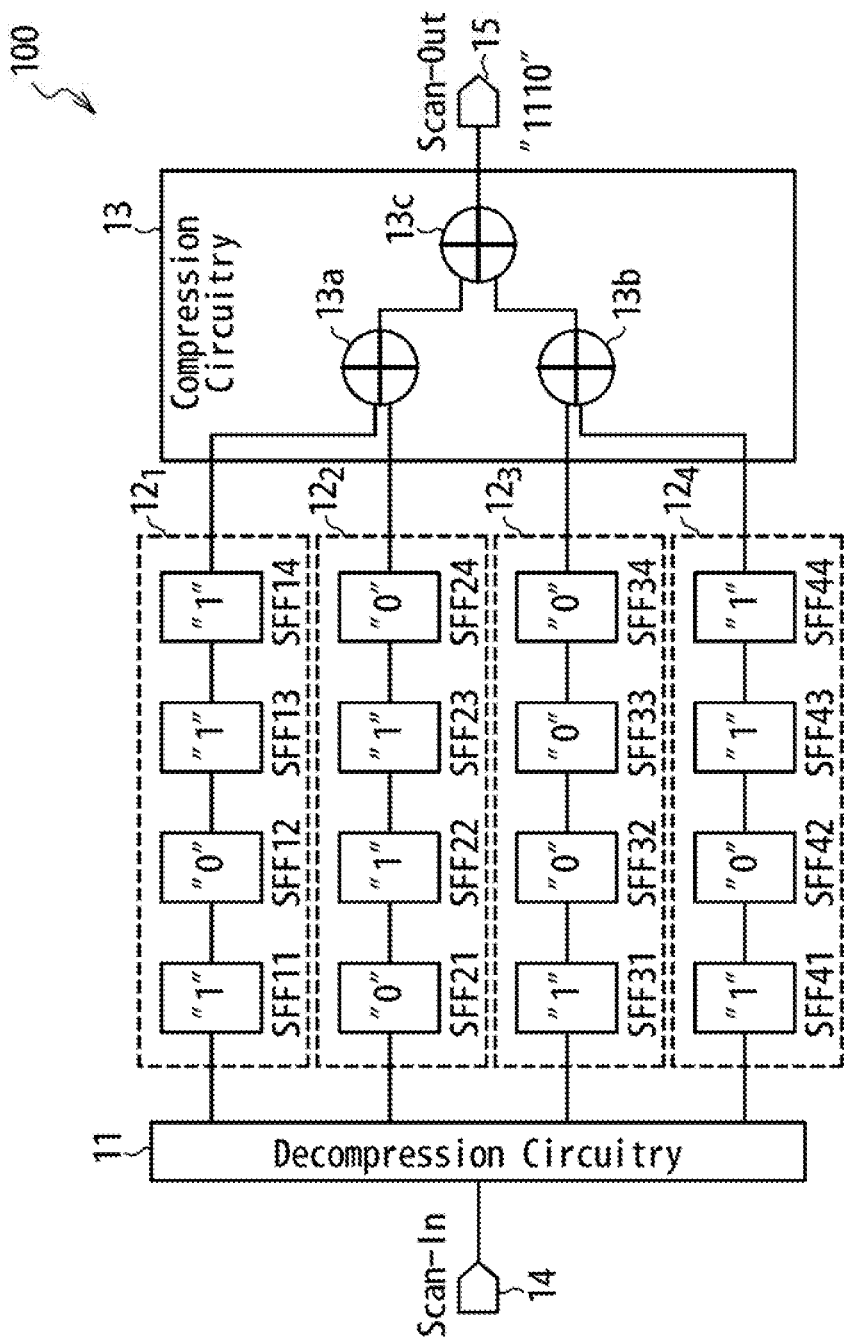
FIG. 1 is a block diagram illustrating an example configuration of a semiconductor integrated circuit, according to one or more embodiments.

In one or more embodiments, as illustrated in FIG. 1, a semiconductor integrated circuit (IC) 100 comprises decompression circuitry 11, scan chains $12_1$ to $12_4$, and compression circuitry 13.

In one or more embodiments, the decompression circuitry 11 is configured to generate test data by decompressing compressed test data supplied to a scan-in terminal 14 and supply the generated test data to the respective scan chains $12_1$ to $12_4$.

In one or more embodiments, the scan chains $12_1$ to $12_4$ each comprise serially-connected scan flipflops SFF. In one or more embodiments, the scan chain $12_1$ comprises scan flipflops SFF11 to SFF14, and the scan chain $12_2$ comprises scan flipflops SFF21 to SFF24. In one or more embodiments, the scan chain $12_3$ comprises scan flipflops SFF31 to SFF34, and the scan chain $12_4$ comprises scan flipflops SFF41 to SFF44. The number of the scan chains 12 and the numbers of scan flipflops of the respective scan chains 12 may be modified based on the configuration of the semiconductor IC 100.

In one or more embodiments, the compression circuitry 13 is configured to compress output responses outputted from the scan chains $12_1$ to $12_4$ to generate a compressed test result data. In one or more embodiments, the compression circuitry 13 is further configured to output the compressed test result data from a scan-out terminal 15. In one or more embodiments, the compressed test data is externally outputted from the semiconductor IC 100 and supplied to an external tester. In one or more embodiments, a failure of the semiconductor IC 100 is detected by the external tester.

In one or more embodiments, the compression circuitry 13 comprises XOR circuitry 13*a* to 13*c* and is configured to output an exclusive OR of the output responses outputted from the scan chains 12$_1$ to 12$_4$ as the compressed test result data. In such an embodiment, when the output responses stored in the scan flipflops SFF14, SFF24, SFF34, and SFF44 are "1", "0", "0", and "1", respectively, for example, a bit corresponding to the output responses of the compressed test data is "0." Similarly, when the output responses stored in the scan flipflops SFF13, SFF23, SFF33, and SFF43 are "1", "1", "0", and "1", respectively, a bit corresponding to the output responses of the compressed test data is "1."

Figure 2:
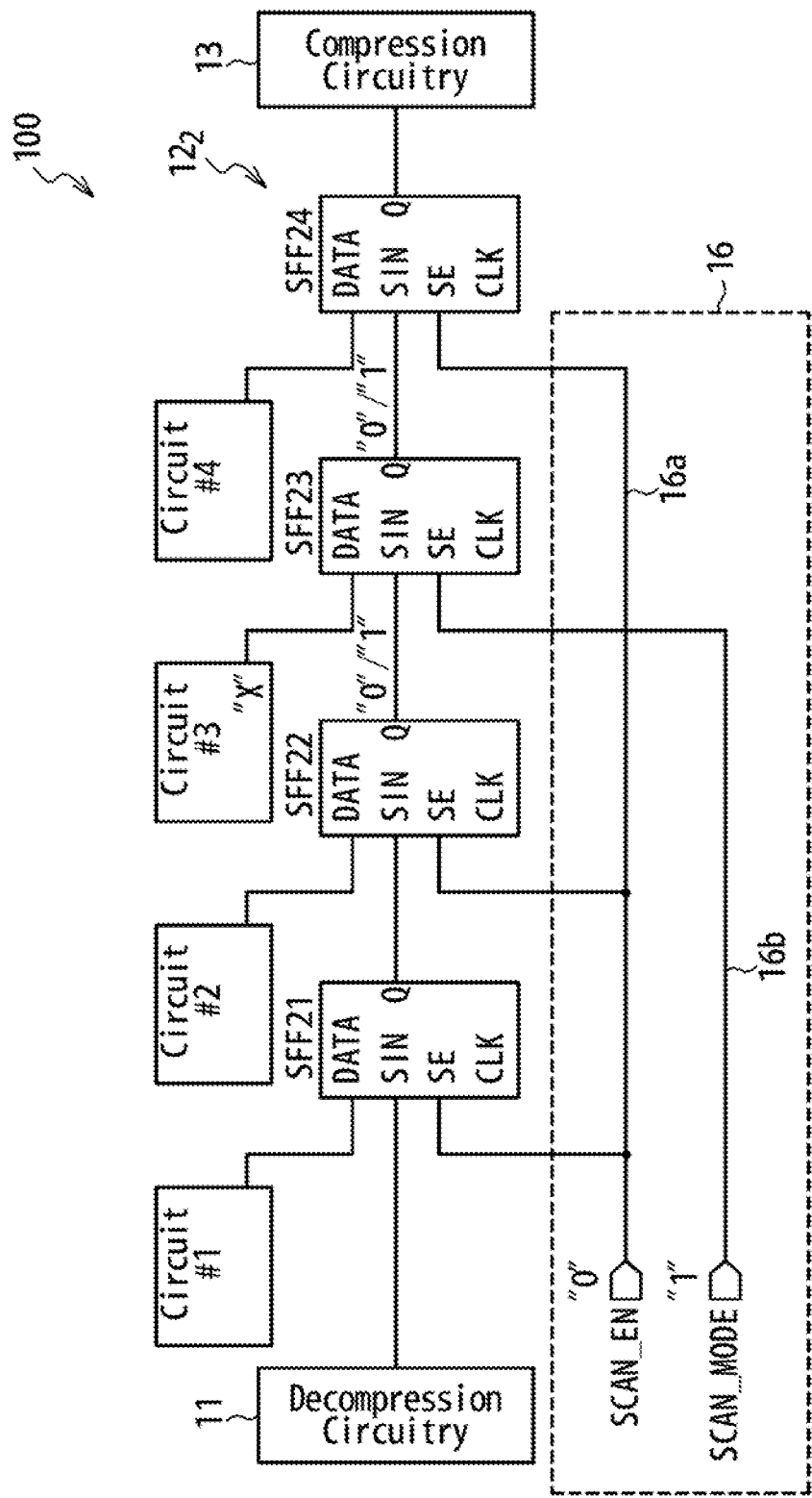
FIG. 2 is a circuit diagram illustrating an example configuration of a semiconductor integrated circuit, according to one or more embodiments.

In one or more embodiments, as illustrated in FIG. 2, each scan flipflop SFF comprises a data input DATA, a scan input SIN, a scan enable terminal SE, a clock terminal CLK, and a data output Q. Although FIG. 2 only illustrates the scan flipflops SFF21 to SFF24 of the scan chains 12$_2$, a person skilled in the art would appreciate that other scan flipflops SFF may be similarly configured.

In one or more embodiments, the data input of each scan flipflop SFF is connected to a circuit from which an output value is to be captured in a scan test. FIG. 2 illustrates that the scan flipflops SFF21, SFF22, SFF23, and SFF24 are respectively connected to circuits #1, #2, #3, and #4 to be tested.

In one or more embodiments, the scan input SIN is connected to a data output Q of a different flipflop of the scan chain or the decompression circuitry 11. FIG. 2 illustrates that the scan input SIN of the scan flipflop SFF21 is connected to the decompression circuitry 11, and the scan inputs SIN of the scan flipflops SFF22, SFF23, and SFF24 are connected to the data outputs Q of the scan flipflops SFF21, SFF22, and SFF23, respectively.

In one or more embodiments, the clock terminal CLK is supplied with a clock signal (not shown). In one or more embodiments, each scan flipflop SFF is configured to capture an input value of the data input DATA or the scan input SIN in synchronization with the clock signal supplied to the clock terminal CLK.

In one or more embodiments, each scan flipflop SFF is configured to select the data input DATA or the scan input SIN based on a value of the scan enable terminal SE and capture a value inputted to the selected input. In one or more embodiments, when the scan enable terminal SE of a scan flipflop SFF is disabled, for example, set to "0", the scan flipflop SFF captures the input value of the data input DATA. In one or more embodiments, when the scan enable terminal SE is enabled, for example, set to "1", the scan flipflop SFF captures the input value of the scan input SIN. The value captured by each scan flipflop SFF is output from the data output Q.

In one or more embodiments, the semiconductor IC 100 has at least two operation modes in scan testing: a shift mode and a capture mode. In one or more embodiments, the shift mode is an operation mode in which the scan chains are operated as shift registers. In the shift mode, test values may be set to the respective scan flipflops through a shift operation, and values captured in the capture mode may be read out through a shift operation. In one or more embodiments, the capture mode is an operation mode in which scan chains capture values from circuits connected to the data inputs of the scan flipflops thereof. In various embodiments, one or more of the scan flipflops may not be configured to capture values from circuits connected to the data inputs thereof. Further, in one or more embodiments, at least one of the scan flipflops SFF is configured to capture a value from the scan input SIN in the capture mode.

In one or more embodiments, the semiconductor IC 100 is configured to allow at least one of the scan flipflops SFF to select the scan input SIN thereof when the semiconductor IC 100 is placed in the capture mode. In one or more embodiments, other scan flipflops SFF select the data inputs DATA thereof when the semiconductor IC 100 is placed in the capture mode.

In one or more embodiments, each scan flipflop SFF receives a scan enable signal SCAN_EN or a scan mode signal SCAN_MODE from the scan control circuitry 16 on the scan enable terminal SE thereof. In one or more embodiments, the scan enable signal SCAN_EN is asserted, for example, set to "1", when the semiconductor IC 100 is placed in the shift mode, and deasserted, for example, set to "0", when the semiconductor IC 100 is placed in the capture mode. In one or more embodiments, the scan mode signal SCAN_MODE places the semiconductor IC 100 into a scan mode. In one or more embodiments, the scan mode signal SCAN_MODE is continuously asserted during a scan test of the semiconductor IC 100.

In one or more embodiments, a scan flipflop SFF that receives the scan enable signal SCAN_EN on the scan enable terminal SE thereof selects the data input DATA when the semiconductor IC 100 is placed in the capture mode. This scan flipflop SFF captures the input value of the data input DATA in the capture mode, in one or more embodiments.

In one or more embodiments, a scan flipflop SFF that receives the scan mode signal SCAN_MODE on the scan enable terminal SE thereof selects the scan input SIN, even when the semiconductor IC 100 is placed in the capture mode. In such embodiments, this scan flipflop SFF captures the input value of the scan input SIN in the capture mode.

In one or more embodiments, the scan control circuitry 16 supplies the scan mode signal SCAN_MODE to one or more scan flipflops SFF and the scan enable signal SCAN_EN to the remaining scan flipflops SFF. In one or more embodiments, the scan control circuitry 16 comprises a scan enable signal line 16*a* and a scan mode signal line 16*b*. The scan enable signal line 16*a* may be utilized to deliver the scan enable signal SCAN_EN, and the scan mode signal line 16*b* may be used to deliver the scan mode signal SCAN_MODE. In one or more embodiments, the scan mode signal SCAN_MODE is generated by a register (not shown) integrated in the semiconductor IC 100 and supplied to the scan mode signal line 16*b*.

The scan enable signal SCAN_EN or the scan mode signal SCAN_MODE is selectively supplied to the scan enable terminal SE of each scan flipflop SFF, based on a property of a circuit connected to the data input DATA thereof.

In one or more embodiments, the scan enable signal SCAN_EN is supplied to the scan enable terminal SE of a scan flipflop SFF, when the scan flipflop SFF captures a definite value ("1" or "0") from the circuit connected to the data input DATA thereof in a scan test of the semiconductor IC 100.

In one or more embodiments, the scan mode signal SCAN_MODE is supplied to the scan enable terminal SE of a scan flipflop SFF, when the scan flipflop SFF captures an unknown value "X" from the circuit connected to the data input DATA thereof in the scan test of the semiconductor IC 100. Examples in which a scan flipflop SFF captures an unknown value from a circuit connected to the data input DATA thereof are listed below.

A first example is the case when the circuit connected to the data input DATA comprises a macro treated as a black box.

A second example is the case when the scan flipflop SFF is set to capture an unknown value in the capture mode by a test setting of the scan test.

A third example is the case when the data input DATA of the scan flipflop SFF is connected to a data output of a flipflop that does not belong to any scan chains. In one or more embodiments, when a test pattern is generated to achieve a test of a sequential circuit, for example, when sequential automatic test pattern generation (sequential ATPG) is used to generate the test pattern, the value to be captured by the scan flipflop SFF may be definite, even if a flipflop that does not belong to any scan chains is connected to the data input DATA thereof.

A fourth example is the case when a path to the data input DATA is specified as a false path or a multi-cycle path.

In the configuration illustrated in FIG. 2, an unknown value is supplied to the data input DATA of the scan flipflop SFF23 from circuit #3 for a certain setting in a scan test. To address this, the scan mode signal SCAN_MODE is supplied to the scan enable terminal SE of the scan flipflop SFF23. The unknown value may be denoted as "X", when the unknown value is supplied to the data input of a certain scan flipflop SFF. The legend "X" attached to circuit #3 illustrated in FIG. 2 indicates that an unknown value is supplied to the data input of the scan flipflop SFF23 from circuit #3. Further, the scan enable signal SCAN_EN is supplied to the scan enable terminals SE of the scan flipflops SFF21, SFF22, and SFF24.

In one or more embodiments, a scan test of the semiconductor IC 100 configured as illustrated in FIGS. 1 and 2 is achieved as follows. In the following, a description of an example operation of the semiconductor IC 100 in DC scanning is provided, according to one or more embodiments. In one or more embodiments, the DC scanning involves a low-speed scan test to detect a degenerate failure.

In one or more embodiments, the semiconductor IC 100 is placed into the scan mode by asserting the scan mode signal SCAN_MODE.

In one or more embodiments, the semiconductor IC 100 is may be placed into the shift mode by asserting the scan enable signal SCAN_EN and a scan shift operation is performed. This allows the respective scan flipflops SFF to select the scan inputs SIN, and test data are set to the respective scan flipflops SFF via the scan inputs SIN thereof. In various embodiments, external input terminals and scan flipflops connected to inputs of circuits #1 to #4 to be tested, which are used to supply test data.

In one or more embodiments, the semiconductor IC 100 is then placed into the capture mode by deasserting the scan enable signal SCAN_EN. In this state, the scan flipflops SFF21, SFF22, and SFF24, which receive the scan enable signal SCAN_EN on the scan enable terminals SE thereof, select the data input DATA, in one or more embodiments. Further, the scan flipflop SFF23, which receives the scan mode signal SCAN_MODE on the scan enable terminal SE thereof, selects the scan input SIN, in one or more embodiments.

A clock pulse may be supplied to the clock terminals CLK of the respective scan flipflops SFF, and the scan flipflops SFF accordingly perform capture operations. In one or more embodiments, the scan flipflops SFF21, SFF22, and SFF24 captures output values of circuits #1, #2, and #4, respectively. Further, the scan flipflop SFF23 captures an output value of the scan flipflop SFF22, in one or more embodiments.

This operation may make it possible to definitely determine an expected value of the compressed test result data outputted from the compression circuitry 13, even when circuit #3 outputs an unknown value.

Figure 3:
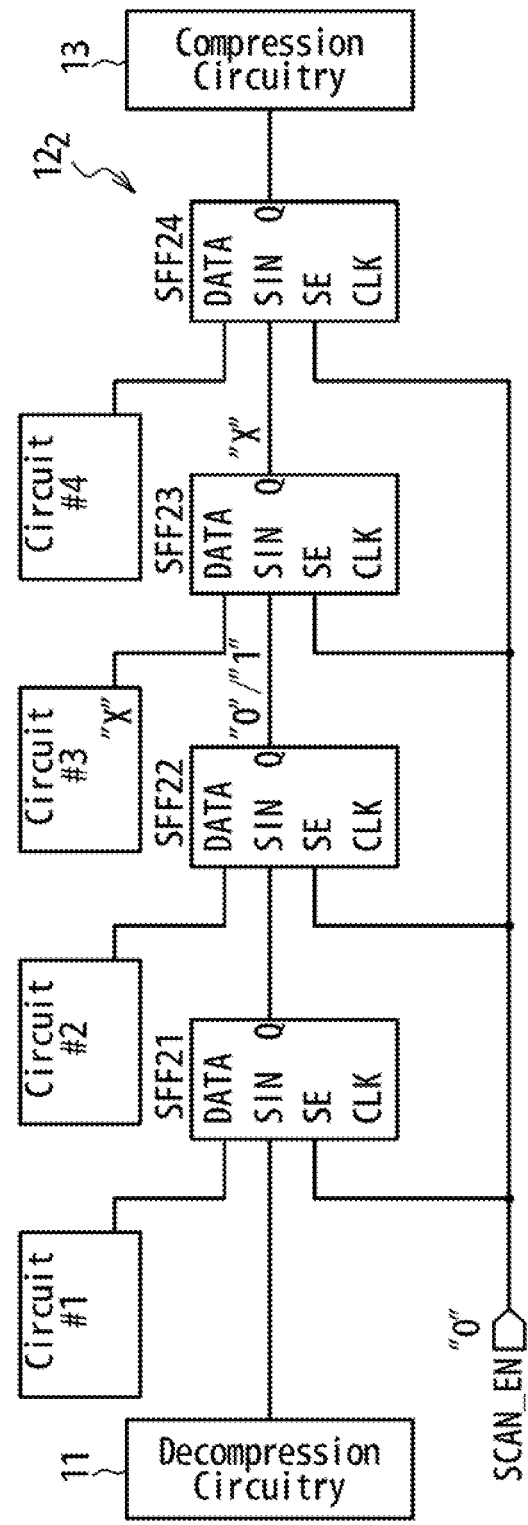
FIG. 3 is a circuit diagram illustrating the configuration of an example semiconductor integrated circuit.

If the scan enable signal SCAN_EN is supplied to the scan enable terminal SE of the scan flipflop SFF23 as illustrated by the embodiment of FIG. 3, the scan flipflop SFF23 captures an unknown value. In this case, it may not be possible to definitely determine an expected value of a compressed test result data obtained by compressing the output responses outputted from the scan flipflops SFF13, SFF23, SFF33, and SFF43. This may not make it possible to detect failures of circuits connected to the data inputs of the scan flipflops SFF13, SFF33, and SFF43, as well as a failure of circuit #3, which is connected to the data input DATA of the scan flipflop SFF23.

With respect to the configuration illustrated in FIG. 2, the scan flipflops SFF23 captures a known value ("1" or "0") from the scan flipflop SFF22. In this operation, it is possible to definitely determine an expected value of a compressed test result data obtained by compressing the output responses stored in the scan flipflops SFF13, SFF23, SFF33, and SFF43. In such embodiments, it may be possible to detect failures of the circuits connected to the data inputs of the scan flipflops SFF13, SFF33, and SFF43, improving the fault coverage and/or reducing the number of test patterns.

The configuration of the semiconductor IC 100 illustrated in FIGS. 1 and 2 is also effective for failure detection of a circuit connected to the data output Q of the scan flipflop SFF22 during a scan test in which two or more capture clock pulses are supplied. Examples of such a scan test include DC scanning based on sequential ATPG and AC scanning. In one or more embodiments, the AC scanning involves an at-speed scan test performed to detect a delay fault.

Figure 4:
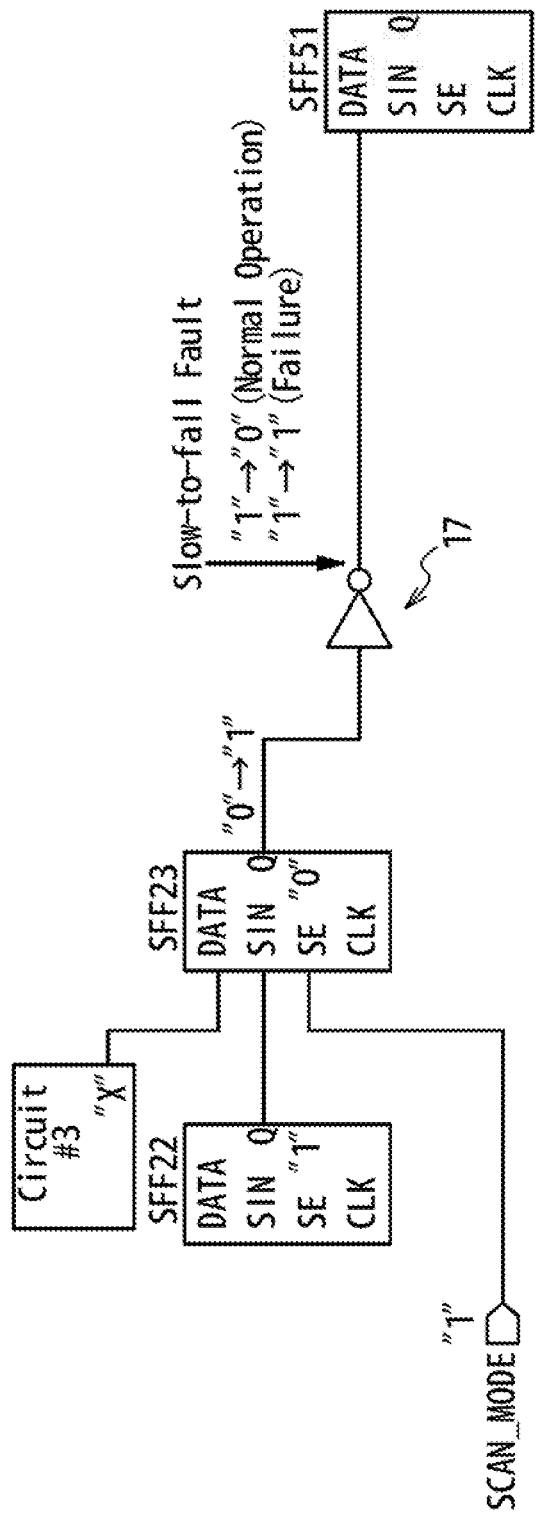
FIG. 4 illustrates AC scanning, according to one or more embodiments.

As illustrated in FIG. 4, for example, the configuration of the semiconductor IC 100 illustrated in FIGS. 1 and 2 may be configured to detect a delay fault of a circuit 17 connected to the data output Q of the scan flipflop SFF23 through AC scanning. In one or more embodiments, a scan flipflop SFF51 is connected to the output of the circuit 17, and a delay fault of the circuit 17 is detected based on a value captured by the scan flipflop SFF51.

In one or more embodiments, when the circuit 17 is configured to output an output signal obtained by inverting an input signal as a whole and a slow-to-fall fault of the output of the circuit 17 is delayed is to be detected, a shift operation is performed in the shift mode to set a value of "0" to the scan flipflop SFF23 and set a value of "1" to the scan flipflop SFF22.

The semiconductor IC 100 may be placed into the capture mode by deasserting the scan enable signal SCAN_EN, in one or more embodiments. Further, the scan flipflop SFF23 may select the scan input SIN in one or more embodiments, since the scan mode signal SCAN_MODE is supplied to the scan enable signal SE of the scan flipflop SFF23.

In one or more embodiments, two clock pulses may be supplied to the clock terminals CLK of the respective scan flipflops SFF to allow the respective scan flipflops SFF to perform a capture operation. In one or more embodiments, the scan flipflop SFF23 captures an output value of the scan flipflop SFF22 in synchronization with the first clock pulse and outputs the captured value to the circuit 17. Subsequently, the scan flipflop SFF51 captures an output value of the circuit 17 in synchronization with the second clock pulse, in one or more embodiments. In this operation, the output value of the scan flipflop SFF23 is definitely switched from "0" to "1". Accordingly, it is possible to detect a slow-to-fall fault of the output of the circuit 17, based on the value captured by the scan flipflop SFF51. In one or more embodiments, when the value captured by the scan flipflop SFF51 sticks to "1", for example, the circuit 17 is determined as suffering from a slow-to-fall fault.

Figure 5:
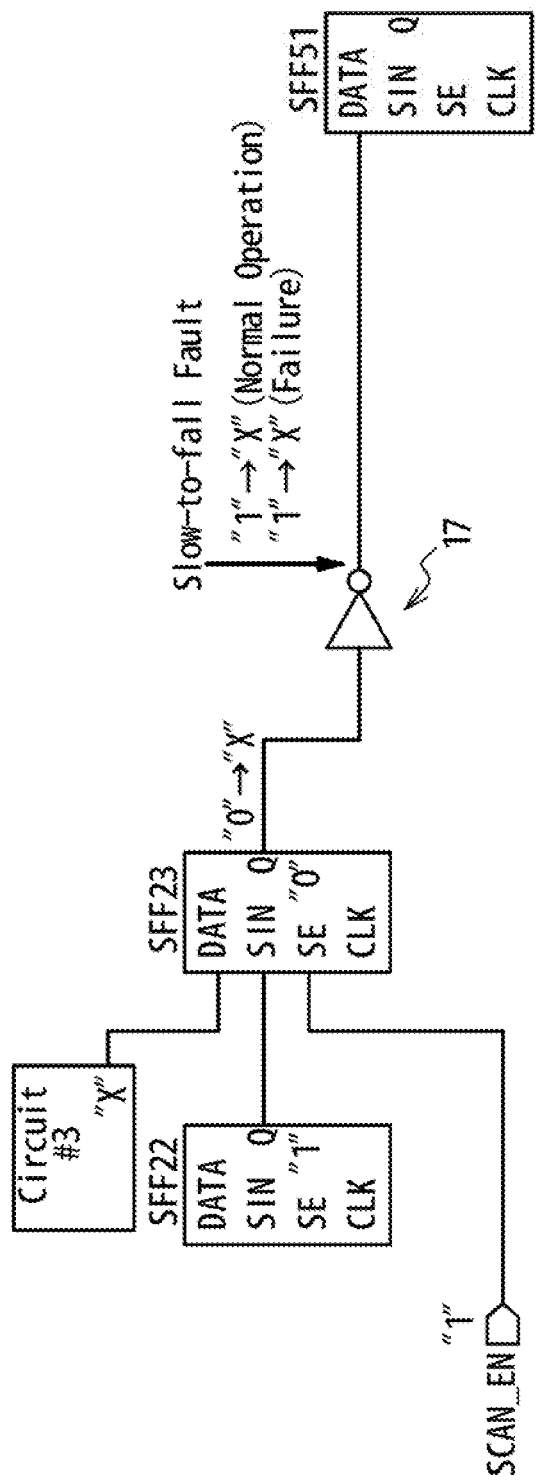
FIG. 5 illustrates example AC scanning, according to one or more embodiments.

In one or more embodiment, when the scan enable signal SCAN_EN is supplied to the scan enable terminal SE of the scan flipflop SFF23 as illustrated in FIG. 5, the scan flipflop SFF23 captures an unknown value from circuit #3. In such an embodiment, the output value of the scan flipflop SFF23 is unknown, and it may be difficult to detect a delay fault of the circuit 17 by AC canning.

Figure 6:
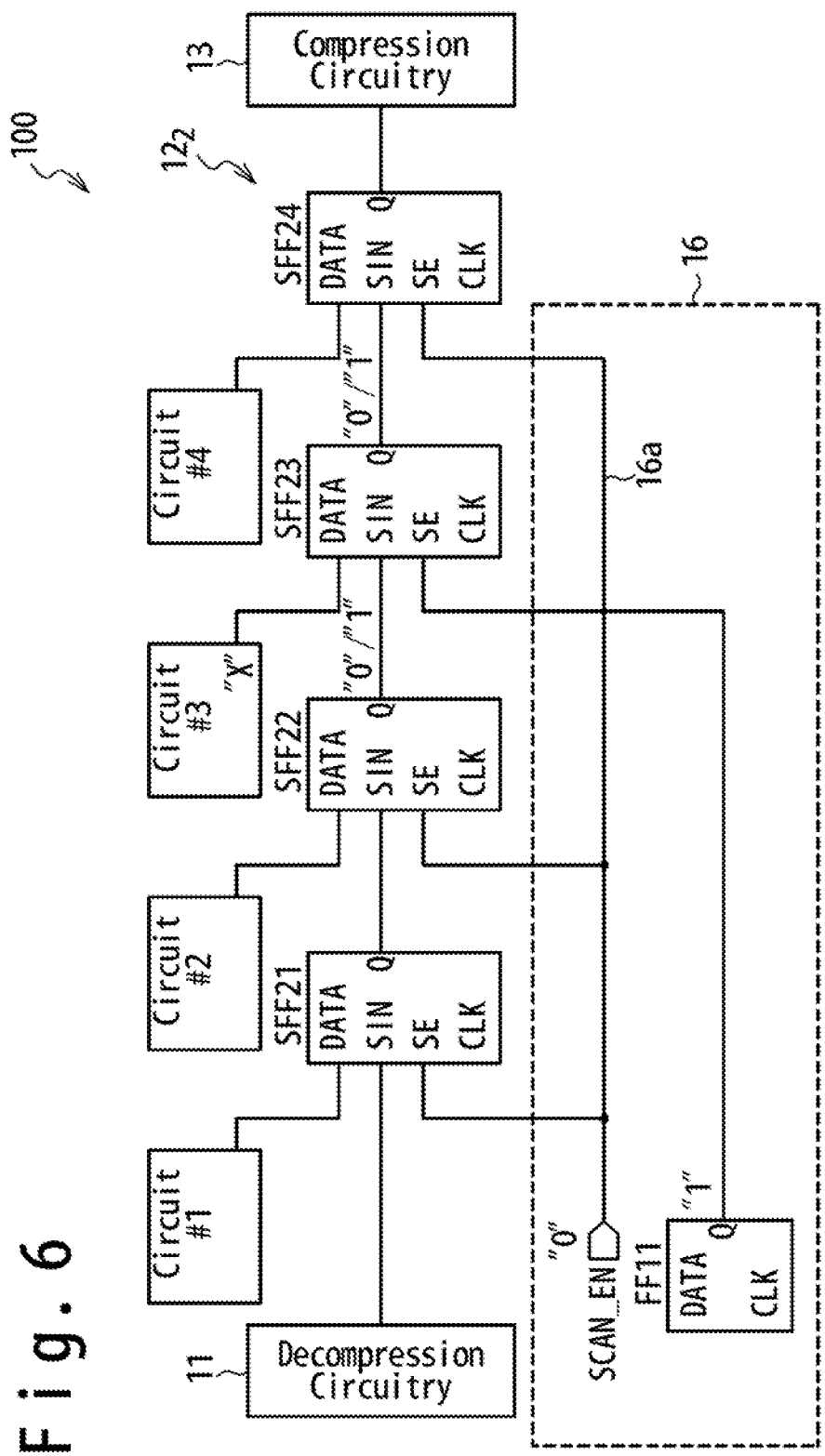
FIG. 6 illustrates an example configuration of a semiconductor integrated circuit, according to one or more embodiments.

The signal supplied to the scan enable terminal SE of a scan flipflop SFF having a data input DATA connected to a circuit that outputs an unknown value is not limited to the scan mode signal SCAN_MODE. For example, a different signal which is asserted while the semiconductor IC 100 is placed in the scan mode may be instead supplied to the scan enable terminal SE of the scan flipflop SFF. In one or more embodiments, as illustrated in FIG. 6, a flipflop FF11 that is set to a value "1" during the scan mode may be disposed in the scan control circuitry 16, and an output signal outputted from the data output Q of the flipflop FF11 may be supplied to the scan enable terminal SE of the scan flipflop SFF.

Figure 7:
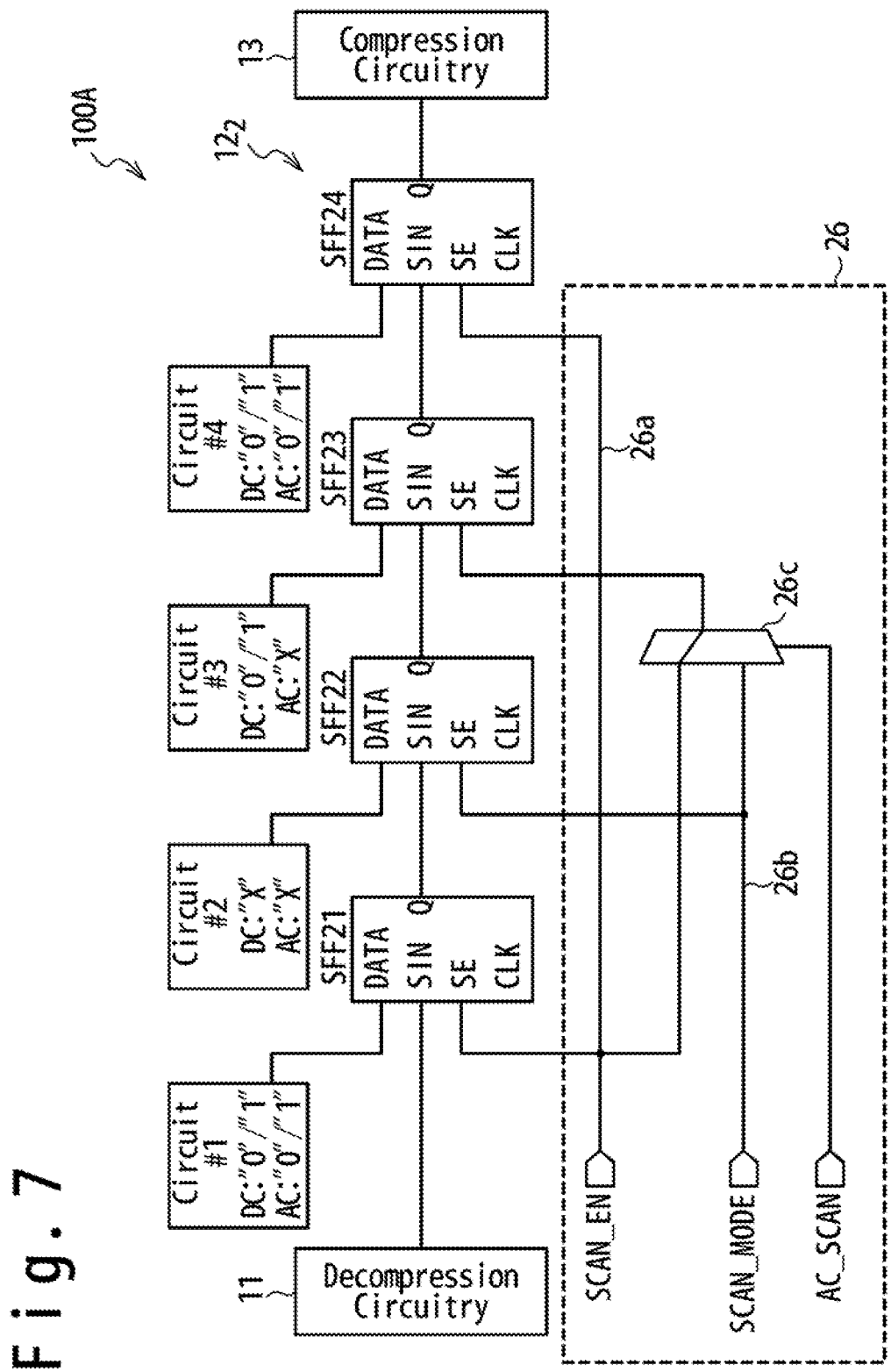
FIG. 7 illustrates an example configuration of a semiconductor integrated circuit, according to one or more embodiments.

In one or more embodiments, as illustrated in FIG. 7, a plurality of types of scan tests may be performed in the scan mode, and the semiconductor IC, denoted by the numeral 100A, is configured to select a signal to be supplied to the scan enable terminal SE of at least one scan flipflop SFF between the scan enable signal SCAN_EN and the scan mode signal SCAN_MODE, based on the type of scan test. In one or more embodiments, DC scanning and AC scanning are performed in the scan mode. The signal supplied to the scan enable terminal SE of the scan flipflop SFF is selected from the scan enable signal SCAN_EN and the scan mode signal SCAN_MODE, based on which of DC scanning and AC scanning is being performed, in addition to the property of the circuit connected to the data input DATA.

In one or more embodiments, the semiconductor IC 100A comprises scan control circuitry 26 configured to supply the scan enable signal SCAN_EN or the scan mode signal SCAN_MODE to the scan enable terminal SE of each scan flipflop SFF.

In one or more embodiments, the scan control circuitry 26 comprises a scan enable signal line 26a, a scan mode signal line 26b, and a selector 26c. In one or more embodiments, the scan enable signal line 26a is configured to deliver the scan enable signal SCAN_EN, and the scan mode signal line 26b is configured to deliver the scan mode signal SCAN_MODE. The selector 26c is configured to select one of the scan enable signal SCAN_EN and the scan mode signal SCAN_MODE and output the selected signal.

In one or more embodiments, the selector 26c is configured to receive an AC scan mode signal AC_SCAN and select one of the scan enable signal SCAN_EN and the scan mode signal SCAN_MODE based on the AC scan mode signal AC_SCAN. In one or more embodiments, the AC scan mode signal AC_SCAN specifies which of AC scanning and DC scanning is performed. For example, the AC scan mode signal AC_SCAN is asserted when AC scanning is performed and deasserted when DC scanning is performed.

In one or more embodiments, circuit #2 is configured so that the output value thereof is unknown for both of AC scanning and DC scanning. To address this, in one or more embodiments, the scan control circuitry 26 is configured to supply the scan mode signal SCAN_MODE to the scan enable terminal SE of the scan flipflop SFF22, which has a data input DATA connected to circuit #2.

In one or more embodiments, circuit #3 is configured so that the output value thereof is unknown during AC scanning and the output value of circuit #3 is definitely determined as "0" or "1" during DC scanning. In one embodiment, the scan control circuitry 26 is configured to supply a signal selected by the selector 26c based on the AC scan mode signal AC_SCAN, to the scan enable terminal SE of the scan flipflop SFF23, which has a data input DATA connected to circuit #3, in one or more embodiments. In one or more embodiments, when AC scanning is performed, the AC scan mode signal AC_SCAN is asserted, and the selector 26c supplies the scan mode signal SCAN_MODE to the scan enable terminal SE of the scan flipflop SFF23. In one or more embodiments, when DC scanning is performed, the AC scan mode signal AC_SCAN is deasserted, and the selector 26c supplies the scan enable signal SCAN_EN to the scan enable terminal SE of the scan flipflop SFF23.

In one or more embodiments, the scan enable signal SCAN_EN is supplied to the scan enable terminals SE of the scan flipflops SFF21 and SFF24, which have data inputs DATA connected to circuits #1 and #4, respectively.

The semiconductor IC 100A as configured in the embodiment illustrated in FIG. 7, is configured to select a signal supplied to the scan enable terminal SE of each scan flipflop SFF, based on the type of scan test.

The signal used to select the signal supplied to the scan enable terminal SE of the scan flipflop SFF23 is not limited to the AC scan mode signal AC_SCAN. A selection signal may be generated based on the type of scan test, and the signal supplied to the scan enable terminal SE of the scan flipflop SFF23 may be selected between the scan enable signal SCAN_EN and the scan mode signal SCAN_MODE, based on the selection signal. In this case, the selection signal may be supplied to the selector 26c, and the selector 26c may select the signal supplied to the scan enable terminal SE of the scan flipflop SFF23 between the scan enable signal SCAN_EN and the scan mode signal SCAN_MODE, based on the selection signal.

Figure 8:
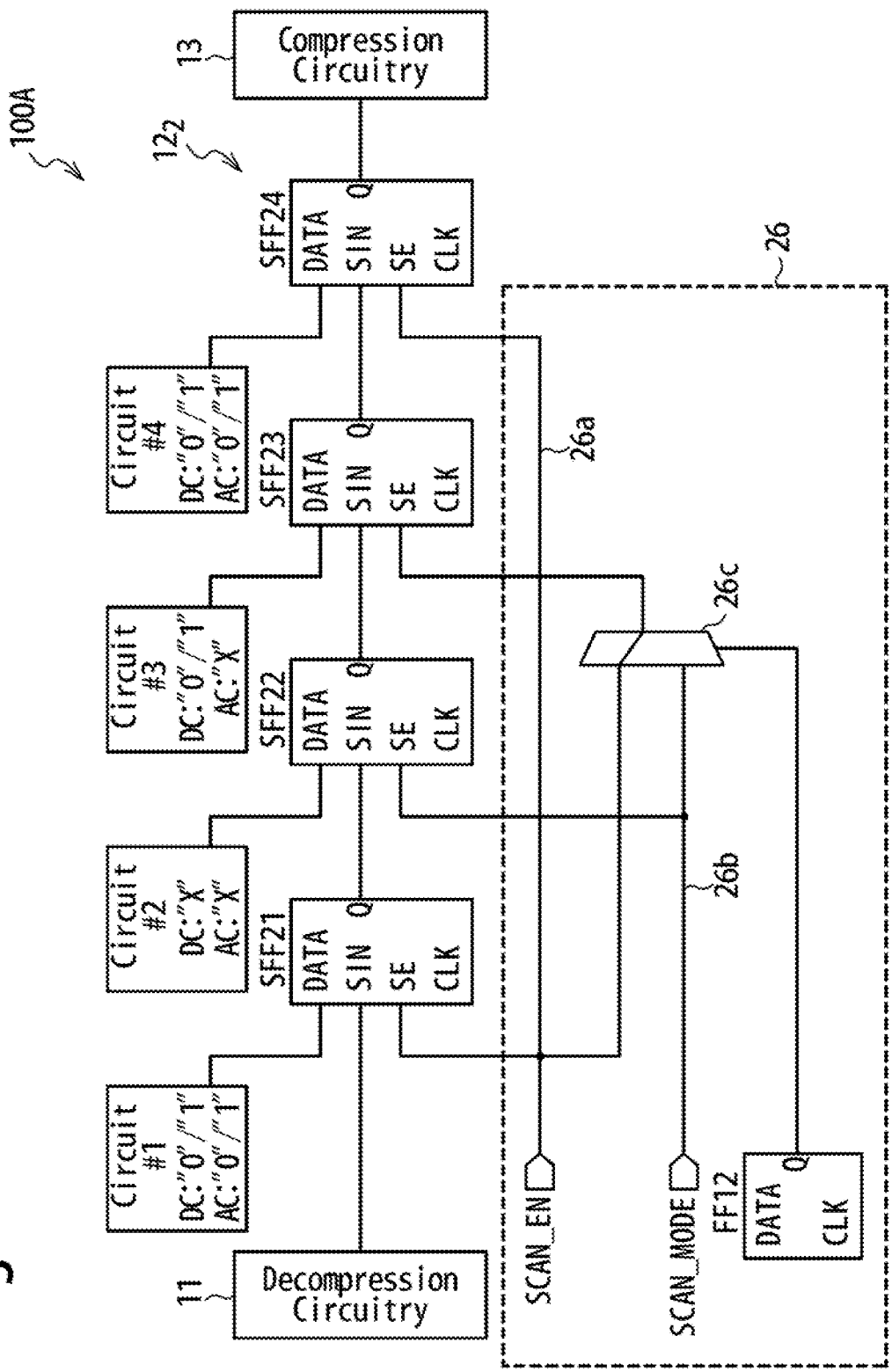
FIG. 8 illustrates an example configuration of a semiconductor integrated circuit, according to one or more embodiments.

For example, as illustrated in FIG. 8, a flipflop FF12 which holds a value based on the type of scan test may be disposed in the scan control circuitry 26, and an output signal outputted from a data output Q of the flipflop FF12 may be supplied to the selector 26c. In such an embodiment, the selector 26c may select the scan enable signal SCAN_EN or the scan mode signal SCAN_MODE based on the output signal from the flipflop FF12 and supply the selected signal to the scan enable terminal SE of the scan flipflop SFF23. In one or more embodiments, a value "1" is set to the flipflop FF12 when AC scanning is performed, and the output signal from the data output Q of the flipflop FF12 is asserted. In such an embodiment, the selector 26c supplies the scan mode signal SCAN_MODE to the scan enable terminal SE of the scan flipflop SFF23. Further, when DC scanning is performed, a value "0" is set to the flipflop FF12, and the output signal from the data output Q of the flipflop FF12 is deasserted. In such an embodiment, the selector 26c supplies the scan enable signal SCAN_EN to the scan enable terminal SE of the scan flipflop SFF23.

Figure 9:
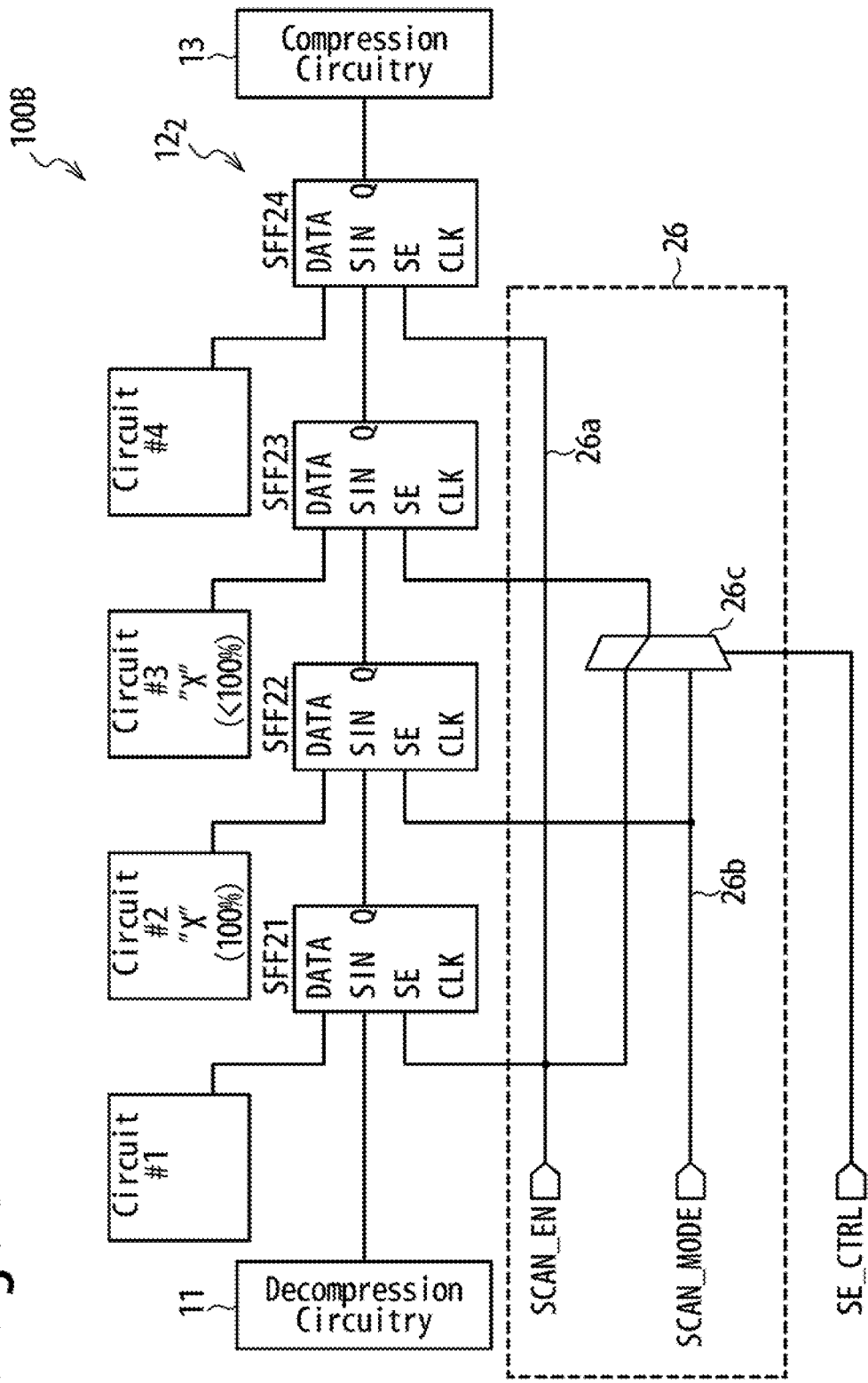
FIG. 9 illustrates an example configuration of a semiconductor integrated circuit, according to one or more embodiments.

In one or more embodiments, as illustrated in FIG. 9, an SE control signal SE_CTRL is supplied from outside the semiconductor IC 100b, to control a signal supplied to a scan enable terminal SE of at least one scan flipflop. In one or more embodiments, a signal selected based on the SE control signal SE_CTRL between the scan enable signal SCAN_EN and the scan mode signal SCAN_MODE is supplied to the scan enable terminal SE of the scan flipflop SFF.

Such an embodiment may be utilized when there is a scan flipflop SFF which may capture an unknown value from the data input DATA thereof, where the probability that the value captured from the data input DATA is unknown is less than 100%. For example, a scan flipflop SFF may capture an unknown value from the data input DATA thereof depending on the configuration and/or operation of the semiconductor IC 100B; however there may be a case when the value captured by scan flipflop SFF cannot be certainly determined as being unknown at a 100% probability. unknown value In one or more embodiments, with respect to the configuration illustrated in FIG. 9, the probability that the value captured by the scan flipflop SFF22 from circuit #2 is unknown is 100%, while the probability that the value captured by the scan flipflop SFF23 from circuit #3 is unknown is larger than 0% and less than 100%. In such an embodiment, the scan mode signal SCAN_MODE is supplied to the scan enable terminal SE of the scan flipflop SFF22, while a signal selected based the SE control signal SE_CTRL between the scan enable signal SCAN_EN and the scan mode signal SCAN_MODE is supplied to the scan enable terminal SE of the scan flipflop SFF23. In one or more embodiments, the SE control signal SE_CTRL is supplied to the selector 26c of the scan control circuitry 26. Further, the selector 26c may be configured to select one of the scan enable signal SCAN_EN and the scan mode signal SCAN_MODE based on the SE control signal SE_CTRL and supplies the selected signal to the scan enable terminal SE of the scan flipflop SFF23.

The assertion and deassertion of the SE control signal SE_CTRL may be appropriately controlled to improve the fault coverage. In one or more embodiments, the assertion and deassertion of the SE control signal SE_CTRL is determined by an ATPG tool used for the test of the semiconductor IC 100B. In one or more embodiments, both of a first test pattern in which the SE control signal SE_CTRL is asserted and a second test pattern in which the SE control signal SE_CTRL is deasserted are generated and the both test patterns are used for scan tests.

Figure 10:
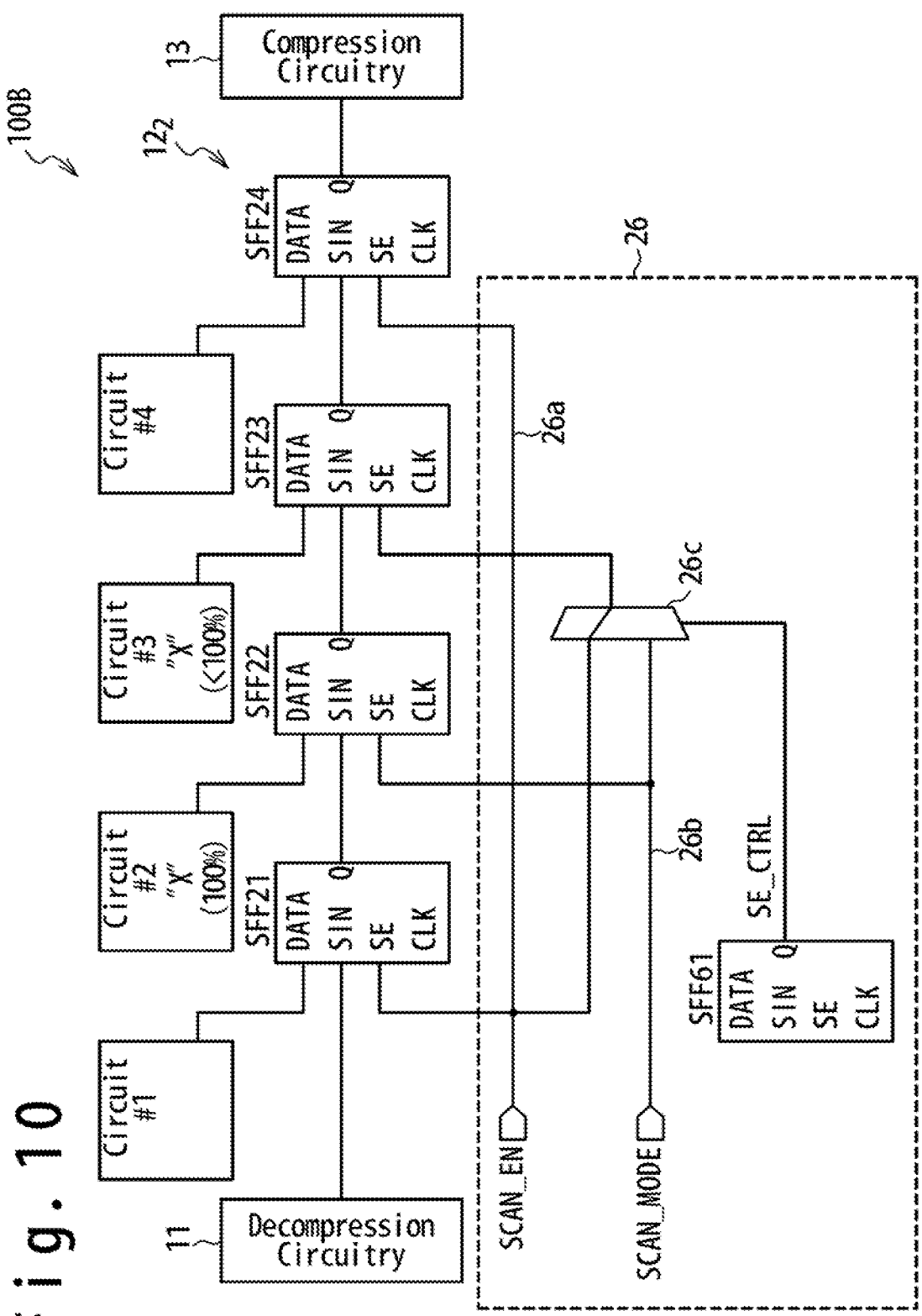
FIG. 10 illustrates an example configuration of a semiconductor integrated circuit, according to one or more embodiments.

In one or more embodiments, as illustrated in FIG. 10, a scan flipflop SFF61 to which a value is externally settable is disposed in the scan control circuitry 26, and an output signal outputted from a data output Q of the scan flipflop SFF61 is used as the SE control signal SE_CTRL supplied to the selector 26c, instead of supplying the SE control signal SE_CTRL from outside the semiconductor IC 100B. In one or more embodiments, the scan flipflop SFF61 is incorporated in a scan chain. When a scan test is performed, a test value is set to the scan flipflop SFF61 through a shift operation in the shift mode, in one or more embodiments.

In one or more embodiments, the SE control signal SE_CTRL is asserted or deasserted based on the value set to the scan flipflop SFF61 during the scan test. In one or more embodiments, the selector 26c selects one of the scan enable signal SCAN_EN and the scan mode signal SCAN_MODE based on the SE control signal SE_CTRL.

Figure 11:
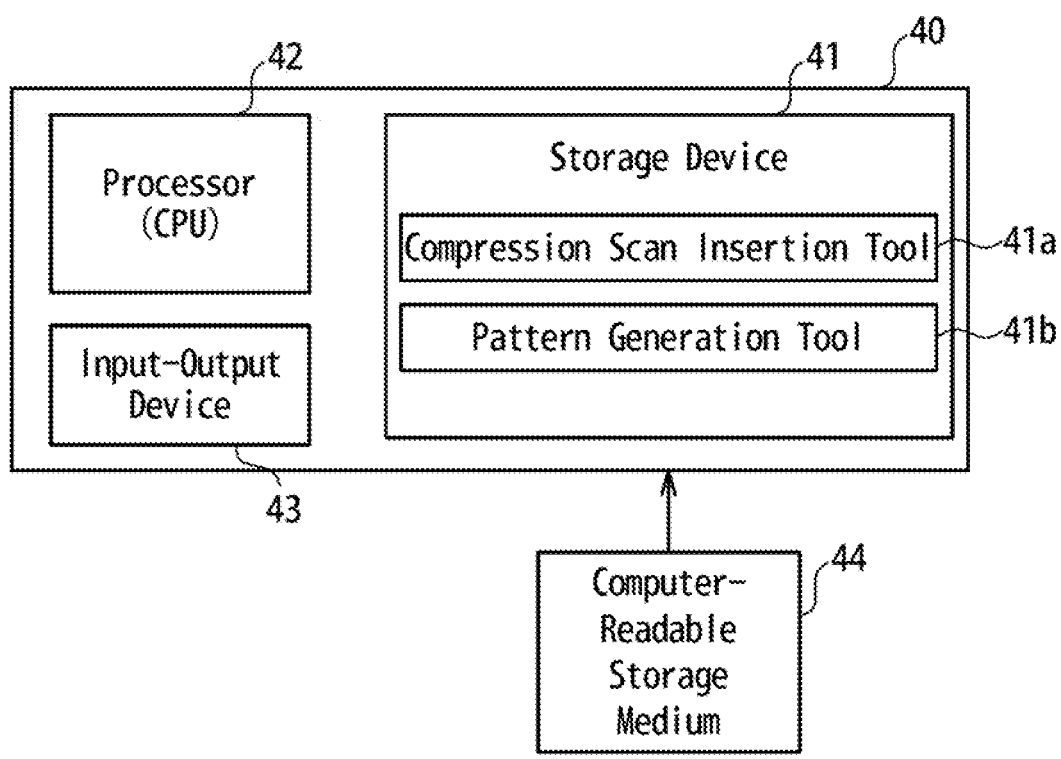
FIG. 11 is a block diagram illustrating an example configuration of a semiconductor integrated circuit, according to one or more embodiments.

In one or more embodiments, the semiconductor integrated circuits 100, 100A, and 100B are designed by using an integrated circuit design apparatus 40 illustrated in FIG. 11. In one or more embodiments, the integrated circuit design apparatus 40 is configured as a computer comprising a storage device 41, a processor 42, and an input-output device 43.

In one or more embodiments, the storage device 41 is installed with a compression scan insertion tool 41a and a pattern generation tool 41b. In one or more embodiments, the storage device 41 is used as a non-transitory tangible storage medium configured to store the compression scan insertion tool 41a and the pattern generation tool 41b. In one or more embodiments, the compression scan insertion tool 41a and the pattern generation tool 41b comprise software programs used to design the semiconductor integrated circuits 100, 100A, and 100B. In one or more embodiments, the compression scan insertion tool 41a and the pattern generation tool 41b may be provided as computer program products installed from a computer-readable storage medium 44 recording the same or downloaded from a server. In one or more embodiments, the storage device 41 additionally stores various data used or generated in designing the semiconductor IC 100, 100A, and 100B.

In one or more embodiments, the processor 42 is configured to execute the compression scan insertion tool 41a and the pattern generation tool 41b. In one or more embodiments, a central processing unit (CPU) is used as the processor 42.

In one or more embodiments, the input-output device 43 is configured to externally receive data used to design the semiconductor IC 100, 100A, and 100B and externally output design data generated by the integrated circuit design apparatus 40, including a netlist and a test pattern data.

Figure 12:
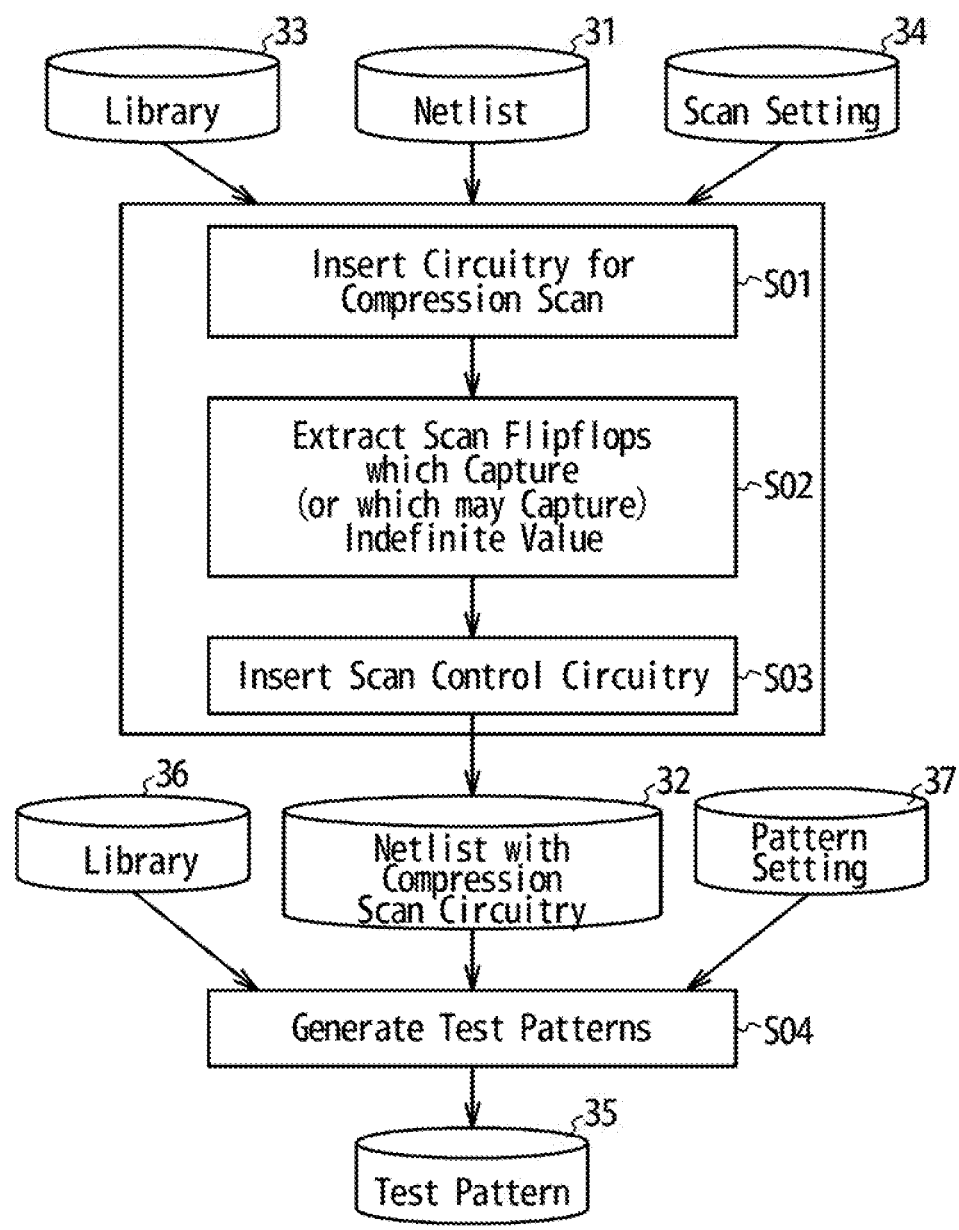
FIG. 12 is a flowchart illustrating an example design procedure of a semiconductor integrated circuit, according to one or more embodiments.

In one or more embodiments, a semiconductor IC 100, 100A, or 100B is designed in a design procedure illustrated in FIG. 12 by using the integrated circuit design apparatus 40.

In this design procedure, a netlist 31 of the semiconductor IC 100, 100A, or 100B is prepared in one or more embodiments. The netlist 31 describes circuit elements incorporated in the semiconductor IC 100, 100A, or 100B to be designed, and connections of the circuit elements. In one or more embodiments, mapping to scan flipflops may be done in generating the netlist 31. In this case, the netlist 31 describes scan flipflops. In one or more embodiments, the netlist 31 of the semiconductor IC 100, 100A, or 100B fails to describe decompression circuitry 11, scan chains 12, compression circuitry 13, and scan control circuitry 16 or 26. The netlist 31 may be stored in the storage device 41.

In one or more embodiments, decompression circuitry 11, scan chains 12, and compression circuitry 13 are inserted into the netlist 31 in step S01. In one or more embodiments, the insertion process in step S01 is achieved by executing the compression scan insertion tool 41a by the processor 42. In one or more embodiments, the netlist into which the decompression circuitry 11, scan chains 12, and compression circuitry 13 have been inserted is stored in the storage device 41.

In one or more embodiments, the insertion process in step S01 begins with reading the netlist 31, a library 33, and a scan setting file 34. The netlist 31, the library 33, and the scan setting file 34 may be stored in the storage device 41. In one or more embodiments, the scan setting file 34 describes settings of a scan test performed on the semiconductor IC 100, 100A, or 100B.

In one or more embodiments, the decompression circuitry 11, the scan chains 12, and the compression circuitry 13 are then inserted with reference to the library 33 and the scan setting file 34. When the netlist 31 describes normal flipflops (instead of scan flipflops), the netlist 31 may be modified so that at least some of the flipflops described in the netlist 31 are replaced with scan flipflops when the scan chains 12 are inserted. In such an embodiment, the netlist 31 is further modified so that the scan flipflops are connected in series to form the scan chains 12. With respect to the semiconductor IC 100 illustrated in FIG. 1, the netlist 31 is modified so that the scan flipflops SFF11 to SFF14 are connected in series to form the scan chain 12$_1$, the scan flipflops SFF21 to SFF24 are connected in series to form the scan chain 12$_2$, the scan flipflops SFF31 to SFF34 are connected in series to form the scan chain 12$_3$, and the scan flipflops SFF41 to SFF44 are connected in series to form the scan chain 12$_4$. The netlist 31 is further modified so that the decompression circuitry 11 and the compression circuitry 13 are inserted.

In step S02, scan flipflops which capture an unknown value from a circuit connected to the data input thereof are extracted, in one or more embodiments. As described above, examples in which a scan flipflop SFF captures an unknown value from the data input DATA thereof may include the case when the circuit connected to the data input DATA is a macro treated as a black box, the case when the output value of the circuit is set to be unknown, the case when the data input DATA is connected to a data output of a flipflop that does not belong to any scan chains, and the case when the path to the data input DATA is specified as a false path or a multicycle path.

Alternatively, scan flipflops which may capture an unknown value from a circuit connected to the data input thereof may be extracted in step S02, in one or more embodiments. In one or more embodiments, scan flipflops which each capture an unknown value from a circuit connected to the data input thereof at a probability more than 0% and less than 100% may be extracted in step S02, in addition to scan flipflops which each capture an unknown value from a circuit connected to the data input thereof at the 100% probability. When the semiconductor IC 100 or 100A illustrated in FIG. 1, 2, 6, 7, or 8 is designed, scan flipflops which each capture an unknown value from a circuit connected to the data input thereof in the 100% probability may be extracted. When the semiconductor IC 100B illustrated in FIG. 9 or 10 is designed, scan flipflops which each capture an unknown value from a circuit connected to the data input thereof at a probability more than 0% and less than 100% may be extracted, in addition to scan flipflops which each capture an unknown value from a circuit connected to the data input thereof at the 100% probability. In one or more embodiments, a probability in which a scan flipflop captures an unknown value is determined and the scan flipflop is extracted based on the determined probability. In one or more embodiments, a scan flipflop is extracted when the probability in which the scan flipflop captures an unknown value is more than 0% and less than 100%.

In step S03, scan control circuitry 16 or 26 is further inserted into the netlist 31, into which the decompression circuitry 11, the scan chains 12, and the compression circuitry 13 have been inserted, to generate a netlist 32 with compression scan circuitry, in one or more embodiments. In one or more embodiments, the scan control circuitry 16 or 26 is inserted so that the scan control circuitry 16 or 26 can control the scan flipflops extracted in step S02 to capture values inputted to the scan inputs thereof in the capture mode. In one or more embodiments, the netlist 32 with the compression scan circuitry obtained in step S03 describes circuit elements incorporated in the semiconductor IC 100 or 100A illustrated in FIG. 1, 2, 6, 7, or 8, or in the semiconductor IC 1006 illustrated in FIG. 9 or 10, and connections of the circuit elements.

In one or more embodiments, the netlist 32 with the compression scan circuitry is generated so that the scan mode signal SCAN_MODE is supplied to the scan enable terminals SE of the scan flipflops SFF extracted in step S02.

In one or more embodiments, the netlist 32 with the compression scan circuitry is generated so that a signal selected by a selector between the scan mode signal SCAN_MODE and the scan enable signal SCAN_EN is supplied to the scan enable terminals SE of the scan flipflops SFF extracted in step S02. With respect to the semiconductor IC 100A illustrated in FIG. 7, for example, the netlist 32 with the compression scan circuitry is generated so that the scan mode signal SCAN_MODE is supplied to the scan enable terminal SE of the scan flipflop SFF22, and the output of the selector 26c is connected to the scan enable terminal SE of the scan flipflop SFF23 in one or more embodiments.

In one or more embodiments, the netlist 32 with the compression scan circuitry is generated so that the scan mode signal SCAN_MODE is supplied to the scan enable terminal SE of a scan flipflop which is configured to capture an unknown value from a circuit connected to the data input thereof at the 100% probability, and a signal selected by a selector between the scan mode signal SCAN_MODE and scan enable signal SCAN_EN is supplied to the scan enable terminal SE of a scan flipflop which is configured to capture an unknown value from a circuit connected to the data input thereof at a probability more than 0% and less than 100%. With respect to the semiconductor IC 100B illustrated in FIG. 9, for example, the netlist 32 with the compression scan circuitry is generated so that the scan mode signal SCAN_MODE is supplied to the scan enable terminal SE of the scan flipflop SFF22, and the output of the selector 26c is connected to the scan enable terminal SE of the scan flipflop SFF23, in one or more embodiments.

In one or more embodiments, the generated netlist 32 with the compression scan circuitry is stored in the storage device 41.

In step S04, test patterns 35 used for a test of the semiconductor IC 100, 100A, or 100B are generated based on the netlist 32 with the compression scan circuitry, in one or more embodiments. In one or more embodiments, the test patterns 35 are generated based on a library 36 and a pattern setting file 37. In one or more embodiments, the test patterns 35 are generated by executing the pattern generation tool 41b by the processor 42, and the generated test patterns 35 are stored in the storage device 41.

In various embodiments, the semiconductor IC 100, 100A or 100B may be implemented from the netlist 32 with the compression scan circuitry, which is generated through steps S01, S02, and S03. In one embodiment, layout data may be generated from the netlist 32, and the layout data may be utilized to implement the semiconductor IC 100, 100A or 1006. The layout data may include a bitstream, or a mask set, amongst others. In one or more embodiments, the semiconductor IC 100, 100A or 100B may be manufactured based on layout data generated from the netlist 32. For example, a bitstream may be loaded into a programmable semiconductor IC to generate the semiconductor IC 100, 100A or 1006. Alternatively, a mask set may be generated from the netlist 32 and utilized to fabricate the semiconductor IC 100, 100A or 1006. For example, implementing the semiconductor IC 100, 100A or 100B may comprise generating a mask set. Further, implementing the semiconductor IC 100, 100A or 100B may comprise manufacturing the semiconductor IC 100, 100A or 100B from the mask set. In one embodiment, the test patterns 35 generated in step S04 are used in a scan test performed in the manufacture process.

In various embodiments, Step S02 (which comprises extracting the scan flipflops that each capture or may capture an unknown value from a circuit connected to the data input thereof) may be performed before step S01 (which comprises inserting the decompression circuitry 11, the scan chains 12, and the compression circuitry 13).

Although various embodiments of this disclosure have been specifically described in the above, a person skilled in the art would appreciate that the techniques described in this disclosure may be implemented with various modifications.

What is claimed is:

1. A semiconductor integrated circuit, comprising:
    a first scan flipflop comprising a first scan input, a first data input, a first selection input, and a first output, wherein the first scan flipflop is configured to:
        output, on the first output, a value corresponding to the first scan input based on a first signal being received at the first selection input; and
        output, on the first output, a value corresponding to the first data input based on a second signal being received at the first selection input; and
    a second scan flipflop comprising a second scan input, a second data input, a second selection input, and a second output, wherein the second scan input is connected to the first output, wherein the second data input is configured to receive an unknown value, wherein the second selection input is configured to receive, based on the second data input corresponding to an unknown value, the first signal, and wherein the second scan flipflop is configured to output, on the second output, a value corresponding to the second scan input based on the first signal being received at the second selection input, wherein the value output on the second output corresponds to the value output on the first output.

2. The semiconductor integrated circuit according to claim 1, further comprising:
    a plurality of scan chains, wherein each scan chain comprises a plurality of scan flipflops, and wherein the first and second scan flipflops are part of one of the plurality of scan chains;
    decompression circuitry configured to generate test data to be supplied to the plurality of scan chains by decompressing compressed test data; and
    compression circuitry configured to generate compressed test result data based on output responses outputted from the plurality of scan chains.

3. The semiconductor integrated circuit according to claim 1, further comprising:
    a selector configured to cause the first signal to be received at the second selection input for a first type of scan test and to cause the second signal to be received at the second selection input for a second type of scan test.

4. The semiconductor integrated circuit according to claim 3, further comprising:
    a flipflop configured to output a value corresponding to a type of scan test;
    wherein the selector is further configured to receive the outputted value corresponding to the type of scan test.

5. The semiconductor integrated circuit according to claim 3, wherein the first type of scan test corresponds to AC scanning and the second type of scan test corresponds to DC scanning; or
    wherein the first type of scan test corresponds to DC scanning and the second type of scan test corresponds to AC scanning.

6. The semiconductor integrated circuit according to claim 1, further comprising:
    a third scan flipflop comprising a third scan input, a third data input, a third selection input, and a third output, wherein the third data input is configured to receive a value for which a probability of the value being unknown is larger than 0% and less than 100%, and wherein the third scan flipflop is configured to:
        output, on the third output, a value corresponding to the third scan input based on the first signal being received at the third selection input; and
        output, on the third output, a value corresponding to the third data input based on the second signal being received at the third selection input; and
    a selector configured to selectively cause the first signal or the second signal to be received at the third selection input.

7. A method of designing a semiconductor integrated circuit, comprising:
    generating, by a device, a netlist of a semiconductor integrated circuit comprising at least one scan flipflop configured to capture a value inputted to a scan input of the at least one scan flipflop in a capture mode, wherein generating the netlist is based on one or more probabilities of one or more respective scan flipflops capturing an unknown value; and
    implementing the semiconductor integrated circuit based on the netlist.

8. The method according to claim 7, wherein generating the netlist comprises generating the netlist to supply a control signal asserted during a scan test to a scan enable terminal of the at least one scan flipflop.

9. The method according to claim 8, wherein generating the netlist comprises generating the netlist to selectively supply a first signal or a second signal to the scan enable terminal of the at least one scan flipflop.

10. The method according to claim 9, wherein generating the netlist further comprises generating the netlist to selectively supply the first signal or the second signal to the scan enable terminal of the at least one scan flipflop based on a type of the scan test.

11. The method according to claim 9, wherein generating the netlist further comprises generating the netlist to selectively supply the first signal or the second signal to the scan enable terminal of the at least one scan flipflop based on the control signal, wherein the control signal is supplied from outside the semiconductor integrated circuit.

12. The method according to claim 7, wherein generating the netlist comprises:
    extracting a scan flipflop configured to capture an unknown value via a data input of the scan flipflop; and
    generating the netlist to allow a first signal to be supplied to a scan enable terminal of the extracted scan flipflop.

13. The method according to claim 7, wherein generating the netlist comprises:
    determining a probability of a scan flipflop capturing an unknown value; and
    generating the netlist to allow a first signal to be supplied to a scan enable terminal of the scan flipflop based on the probability.

14. The method according to claim 7, wherein generating the netlist comprises:
    inserting a plurality of scan chains comprising a scan chain comprising the at least one scan flipflop;
    inserting decompression circuitry configured to generate test data to be supplied to the plurality of scan chains by decompressing compressed test data; and inserting compression circuitry configured to generate compressed test result data based on output responses outputted from the plurality of scan chains.

15. A non-transitory tangible storage medium having processor-executable instructions stored thereon, wherein the processor-executable instructions, when executed, facilitate:
generating a netlist of a semiconductor integrated circuit comprising at least one scan flipflop configured to capture a value inputted to a scan input of the at least one scan flipflop in a capture mode, wherein generating the netlist is based on one or more probabilities of one or more respective scan flipflops capturing an unknown value; and
outputting data for implementing the semiconductor integrated circuit based on the netlist.

16. The non-transitory tangible storage medium according to claim 15, wherein generating the netlist comprises generating the netlist to supply a control signal asserted during a scan test to a scan enable terminal of the at least one scan flipflop.

17. The non-transitory tangible storage medium according to claim 16, wherein generating the netlist comprises generating the netlist to selectively supply a first signal or a second signal to the scan enable terminal of the at least one scan flipflop.

18. The non-transitory tangible storage medium according to claim 15, wherein generating the netlist comprises:
extracting a scan flipflop configured to capture an unknown value via a data input of the scan flipflop; and
generating the netlist to allow a first signal to be supplied to a scan enable terminal of the extracted scan flipflop.

19. The non-transitory tangible storage medium according to claim 15, wherein generating the netlist comprises:
determining a probability of a scan flipflop capturing an unknown value; and
generating the netlist to allow a first signal to be supplied to a scan enable terminal of the scan flipflop based on the probability.

* * * * *